United States Patent
Yamamoto

(10) Patent No.: US 6,677,880 B2
(45) Date of Patent: Jan. 13, 2004

(54) CHOPPER TYPE VOLTAGE COMPARATOR AND ANALOG/DIGITAL CONVERTER USING THE SAME

(75) Inventor: Shyuji Yamamoto, Kanagawa (JP)

(73) Assignee: Innotech Corporation (JP)

( * ) Notice: Subject to any disclaimer, the term of this patent is extended or adjusted under 35 U.S.C. 154(b) by 0 days.

(21) Appl. No.: 10/156,642

(22) Filed: May 29, 2002

(65) Prior Publication Data

US 2002/0196173 A1 Dec. 26, 2002

(30) Foreign Application Priority Data

May 31, 2001 (JP) ........................................ 2001-165285

(51) Int. Cl.[7] .............................................. H03M 1/56
(52) U.S. Cl. ........................ 341/169; 156/158; 156/155; 327/77; 327/63
(58) Field of Search .......................... 341/156, 158, 341/122, 169, 120; 327/77, 63, 215

(56) References Cited

U.S. PATENT DOCUMENTS

| | | | | |
|---|---|---|---|---|
| 3,609,728 A | * | 9/1971 | Quinn et al. ................. | 341/169 |
| 3,725,905 A | * | 4/1973 | Tunzi .......................... | 341/169 |
| 3,750,142 A | * | 7/1973 | Barnes et al. ................ | 341/169 |
| 4,390,864 A | * | 6/1983 | Ormond ...................... | 341/169 |
| 5,099,240 A | * | 3/1992 | Nakatani et al. ............. | 341/156 |
| 5,165,058 A | * | 11/1992 | Nakatani et al. ............. | 341/158 |
| 5,936,434 A | * | 8/1999 | Kumamoto et al. .......... | 327/77 |
| 6,064,239 A | * | 5/2000 | Matsuoka .................... | 327/63 |
| 6,310,572 B1 | * | 10/2001 | Endo et al. .................. | 341/156 |

\* cited by examiner

*Primary Examiner*—Michael Tokar
*Assistant Examiner*—Lam T. Mai
(74) *Attorney, Agent, or Firm*—Lorusso, Loud & Kelly

(57) ABSTRACT

There is provided a chopper type voltage comparator for comparing a sampled input voltage with a ramp voltage that is changed with a time, in which a bias voltage is changed according to the ramp voltage, and then the bias voltage comes up to a predetermined voltage value that is able to bring the chopper type voltage comparator into a comparing operation state when the ramp voltage becomes substantially equal to the input voltage. Accordingly, a voltage comparator whose consumption power can be suppressed rather than the prior art and an analog/digital-converter using the same can be provided.

8 Claims, 2 Drawing Sheets

CHOPPER TYPE VOLTAGE COMPARATOR AND ANALOG/DIGITAL CONVERTER USING THE SAME

BACKGROUND OF THE INVENTION

1. Field of the Invention

The present invention relates to a chopper type voltage comparator and an analog/digital converter.

2. Description of the Related Art

Since the signal read from a solid state imaging device is an analog value, the an analog/digital converter for converting this analog value into the a digital value is needed. Among the devices employed as this analog/digital converter in the prior art, there is the integral column type analog/digital converter.

In this integral column type analog/digital converter, a ramp wave output from a ramp wave generator and the read signal are input into a voltage comparator. Then, a counter that starts counting a clock pulse in synchronism with initiation of the ramp wave is provided at to latch the count value at the instance when the ramp voltage exceeds the read voltage and then output the count value as the digital value. The employed voltage comparator, is a chopper type voltage comparator using an inverter, or the like.

In a solid state imaging device, the analog/digital conversion must be executed for each individual pixels residing on a horizontal line. Therefore, the above number of voltage comparators must equal the number of pixels on one horizontal line. In this case, if the consumption power of an individual voltage comparator is large, the overall consumption power becomes immense.

In the chopper type voltage comparator using the inverter, when the input voltage of the inverter comes close to the operating-point voltage, both the PMOS and the NMOS in the inverter are turned ON and thus a shoot through current flows in the inverter. This shoot through current continues to flow while this ON state is maintained. This shoot through current acts as a factor to increase the consumption power of the chopper type voltage comparator and thus increases the overall consumption power of the analog/digital converter.

In order to prevent this, one may consider reducing the shoot through current by extending the channel lengths of the PMOS and the NMOS. In this case, however, since the gate capacitance of the inverter increases, the output gain of the analog/digital converter degrades with respect to the ramp wave.

SUMMARY OF THE INVENTION

The present invention has been made in view of the problem in the prior art, and it is an object of the present invention to provide a voltage comparator and an analog/digital converter using the same wherein power consumption is reduced from the prior art.

According to the chopper type voltage comparator of the present invention, instead of applying a constant bias voltage to the comparator, the bias voltage is varied in accordance with the ramp voltage during the comparing operation. Then, when ramp voltage becomes substantially equal to the input voltage, the bias voltage is made into the predetermined voltage value that can bring the comparator into its comparing operation state.

According to this operation, only a small quantity of bias current flows through the comparator in the period when the ramp voltage is small, whereas a sufficient bias current for enabling the comparator to perform a desired comparing operation flows when the ramp voltage becomes substantially equal to the input voltage.

In this manner, in the present invention, since the bias current is not constant but is gradually increased, total current that flows through the comparator can be reduced and also the consumption power can be reduced.

An example of the chopper type voltage comparator according to the present invention is exemplified in FIG. 1. As shown in FIG. 1, this chopper type voltage comparator 1 comprises an input capacitor C2, a bias capacitor C3, and a first differential amplifier OP1. This first differential amplifier OP1 has a first input terminal INP, a second input terminal INM, and a bias terminal BIAS. An operating-point voltage ($V_{OP}^{(1)}$) for the first differential amplifier OP1 is applied to the first input terminal INP, a voltage at one end of the input capacitor C2 is applied to the second input terminal INM, and a voltage at one end of the bias capacitor C3 is applied to the bias terminal BIAS.

In operation, a difference ($V_{OP}^{(1)}-V_{AIN}$) between the operation-point voltage ($V_{OP}^{(1)}$) and the input voltage ($V_{AIN}$) is sample-held in the input capacitor C2 and also a difference ($V_{BN}-V_{AIN}$) between a predetermined voltage ($V_{BN}$) and the input voltage ($V_{AIN}$) is sample-held in the bias capacitor C3 in a sampling period.

After this, a ramp voltage ($V_{RAMP}$) is applied to other ends of the input capacitor C2 and the bias capacitor C3 respectively. According to this, a voltage $V_{INM}^{(1)}$ at one end of the input capacitor C2 becomes a sum ($V_{OP}^{(1)}-V_{AIN}+V_{RAMP}$) of a voltage ($V_{OP}^{(1)}-V_{AIN}$), which has already been sample-held in the input capacitor C2, and the ramp voltage ($V_{RAMP}$) applied to the other end. Similarly, the voltage $V_{BIAS}$ at one end of the bias capacitor C3 becomes a sum ($V_{BN}-V_{AIN}+V_{RAMP}$) of a voltage ($V_{BN}-V_{AIN}$), which has already been sample-held in the bias capacitor C3, and the ramp voltage ($V_{RAMP}$) applied to the other end. Since voltages at each one ends of the input capacitor C2 and the bias capacitor C3 are applied to the second input terminal and the bias terminal respectively, voltage values applied to each terminals at this timing are given as follows:

First input terminal INP . . . $V_{OP}^{(1)}$

Second input terminal INM . . . $V_{OP}^{(1)}-V_{AIN}+V_{RAMP}$

Bias terminal BIAS . . . $V_{BN}-V_{AIN}+V_{RAMP}$

In the first differential amplifier OP1, the voltages of the first and second input terminals, i.e., $V_{OP}^{(1)}$ and $V_{OP}^{(1)}-V_{AIN}+V_{RAMP}$ are compared, and its outputs are inverted when these two voltages become equal to each other. The equality of both voltages means $V_{OP}^{(1)}=V_{OP}^{(1)}-V_{AIN}+V_{RAMP}$ and this means $V_{AIN}=V_{RAMP}$. Therefore, the input voltage ($V_{AIN}$) and the ramp voltage ($V_{RAMP}$) are compared in the above operation.

It should be noted that the voltage of the bias terminal is $V_{BIAS}=V_{BN}-V_{AIN}+V_{RAMP}$, which is smaller than $V_{BN}$ at the period of $V_{RAMP}<V_{AIN}$ and becomes firstly $V_{BN}$ at the timing of $V_{RAMP}=V_{AIN}$ at which the first differential amplifier OP1 starts to execute the desired comparing operation. Due to the behavior of this $V_{BIAS}$, merely a small quantity of bias current flows through the first differential amplifier OP1 at the timing of $V_{RAMP}<V_{AIN}$, while the bias current value that allows the above desired comparing operation is supplied at the timing of $V_{RAMP}=V_{AIN}$.

In this manner, since the bias current is not constant but increased gradually in accordance with the ramp voltage, the consumption power in the first differential amplifier OP1 can be reduced.

In this case, a second differential amplifier OP2 may be provided at the later stage of the first differential amplifier OP1. By doing this, the gain of the output can be increased.

In case where the second differential amplifier OP2 is provided in this way, an offset canceling capacitor C4 (C5) may be provided between the first and second differential amplifiers OP1, OP2 and then the difference of the operating-point voltages between the first and second differential amplifiers OP1, OP2 may be held in the offset canceling capacitor. By doing this, deviation of the inverting timing of the output of the second differential amplifier OP2 from the output of the first differential amplifier OP1 due to the difference of the operating-point voltages between two differential amplifiers OP1, OP2 is prevented.

Also, the analog/digital converter of the present invention comprises a counter 5 and a latch circuit 4 for latching a count value of the counter 5 based on an output of the chopper type voltage comparator 1 and outputting the latched count value as an analog/digital-converted value of the input voltage of the comparator 1.

As described above, since the consumption power of the comparator 1 can be reduced, the consumption power of the analog/digital converter using the same can also be reduced.

DESCRIPTION OF THE PREFERRED EMBODIMENTS

Preferred embodiments of the present invention will be explained in detail with reference to the accompanying drawings hereinafter.

(1) Explanation of a Circuit Configuration of the Present Embodiment

Figure 1:
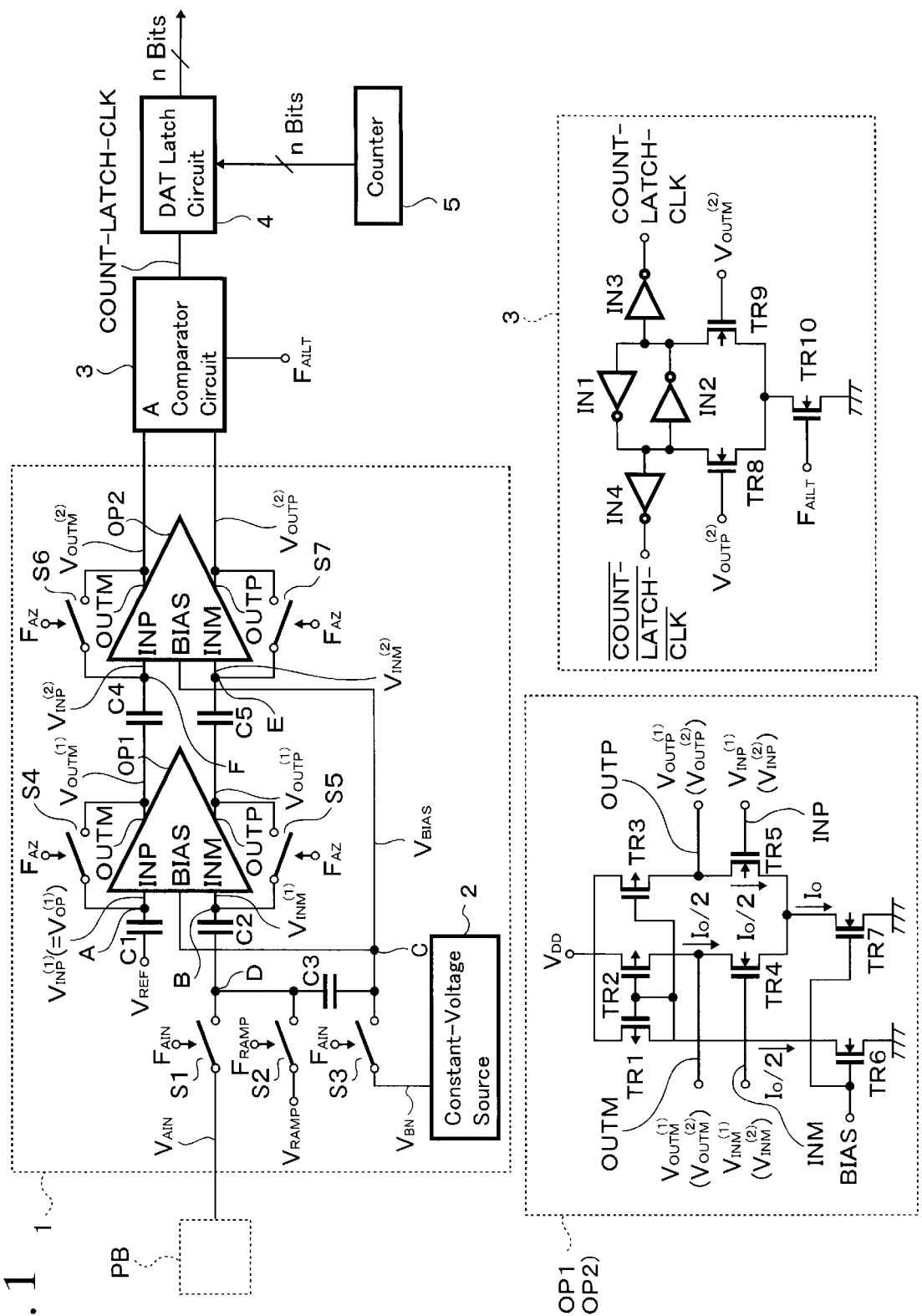
FIG. 1 is a circuit diagram showing an analog/digital converter according to an embodiment of the present invention.

FIG. 1 is a circuit diagram showing an analog/digital converter according to an embodiment of the present invention. FIG. 1 shows the case where an output voltage $V_{AIN}$ from a unit pixel PB of a solid state imaging device is analog/digital-converted. However, this is not to be meant that the present invention is limited only to the solid state imaging device.

In the pixel portion PB, structure of a CCD or of a MOS type image sensor, etc., for example, may be employed. When the MOS type is employed among these structures, MOS type image sensor of the threshold voltage modulating type is preferable. Such a MOS type image sensor of the threshold voltage modulating type is described in detail in the invention, the patent right of which has already been acquired by the applicant of this application (Japanese patent registered No. 2935492, and U.S. Pat. No. 6,051,857).

An output voltage $V_{AIN}$ is input into a chopper type voltage comparator 1 that characterizes the present invention. As shown in FIG. 1, this chopper type voltage comparator 1 has first and second differential amplifiers OP1 and OP2. These amplifiers OP1 and OP2 have a positive input terminal INP (first input terminal), a negative input terminal INM (second input terminal), and a bias terminal BIAS.

Focusing on the first differential amplifier OP1, a voltage $V_{INM}^{(1)}$ at one end of a capacitor C2 (input capacitor) is applied to the negative input terminal INM. Then, a voltage at one end of a capacitor C3 (bias capacitor), i.e., a bias voltage $V_{BIAS}$, is applied to the bias terminal BIAS. Meanwhile, a voltage $V_{INP}^{(1)}$ at one end of a capacitor C1 is applied to the positive input terminal INP, and a reference voltage $V_{REF}$ is applied to the other end side of the capacitor C1.

In FIG. 1, the reference numeral 2 denotes a constant-voltage source that is provided to bias a constant voltage $V_{BN}$.

Circuit configurations of the differential amplifiers OP1, OP2 are shown in a square indicated by a dotted-line in FIG. 1, and comprise driving transistors TR4, TR5 and load transistors TR2, TR3. These transistors are used in their saturation region and have a large amplification factor.

Also, a transistor TR1 is current-mirror-connected to the load transistors TR2 and TR3, and serve to supply the same current $I_o/2$ between the source-drain of these load transistors TR2, TR3 respectively.

Meanwhile, a bias voltage $V_{BIAS}$ is applied to a gate of a transistor TR7 that serves as a constant-current source to bias a bias current $I_o$ to the first differential amplifier OP1. Similarly, a transistor TR6 is used as a constant-current source to bias the bias current $Io/2$ to the transistor TR1.

The chopper type voltage comparator 1 has switches S1 to S7. These switches can be constructed by a single transistor, plural transistors, or the like, and are controlled by control signals $F_{AZ}$, $F_{AIN}$, $F_{RAMP}$ as shown in FIG. 1.

A comparator circuit 3 having a latch function is provided at the subsequent stage of the chopper type voltage comparator 1. A circuit configuration of the comparator circuit 3 is shown in a square indicated by a dotted line in FIG. 1, and has inverters IN1 to IN4 and driving transistors TR8, TR9.

When one of input voltages $V_{OUTM}^{(2)}$ and $V_{OUTP}^{(2)}$ is at a high level and the other of them is at a low level, only any one of the driving transistors TR8, TR9 is brought into its ON state. In this state, output signals COUNT-LATCH-CLK (not shown in the upper circuit diagram in FIG. 1), COUNT-LATCH-CLK are not changed. In other words, the output is latched.

However, when the input voltages $V_{OUT}^{(2)}$ and $V_{OUTP}^{(2)}$ start to invert, one of transistors TR8, TR9, which is in its ON state up to now, is turned OFF and the other transistor, which is in its OFF state up to now, is turned ON. Accordingly, the output signals COUNT-LATCH-CLK, COUNT-LATCH-CLK are also inverted. The higher one of the signals COUNT-LATCH-CLK and COUNT-LATCH-CLK is amplified largely to the voltage close to the power supply $V_{DD}$ by the loop of the inverters IN1, IN2. Although not shown, the power supply voltage $V_{DD}$ is applied to the inverters IN1, IN2.

In FIG. 1, TR10 denotes a transistor that is provided to bias the bias current to the driving transistors TR8, TR9, and is driven by a signal $F_{AILT}$. This signal $F_{AILT}$ has a pulse waveform, and the transistor TR10 is operated in its saturation range only when the signal $F_{AILT}$ is at a high level. The transistor TR10 is not operated when the signal $F_{AILT}$ is at a low level, and thus the comparator circuit 3 is also not operated. In this manner, since the comparator circuit 3 is not always operated but operated intermittently, the consumption power of the circuit can be suppressed.

Such comparator circuit 3 is provided in order to obtain the signal COUNT-LATCH-CLK that has a large voltage value enough to make a DAT latch circuit 4 latch the data therein. If the output voltage of the comparator 1 is large enough to latch the data in DAT latch circuit 4, the comparator circuit 3 may be omitted.

The count value (n-bit digital value) being output from a counter 5 is input into the DAT latch circuit 4. This DAT latch circuit 4 latches the above count value when the signal COUNT-LATCH-CLK becomes the high level.

The analog/digital converter is constructed by the chopper type voltage comparator 1, the comparator circuit 3, the DAT latch circuit 4, and the counter 5.

(2) Explanation of an Operation of the Present Embodiment

Figure 2:
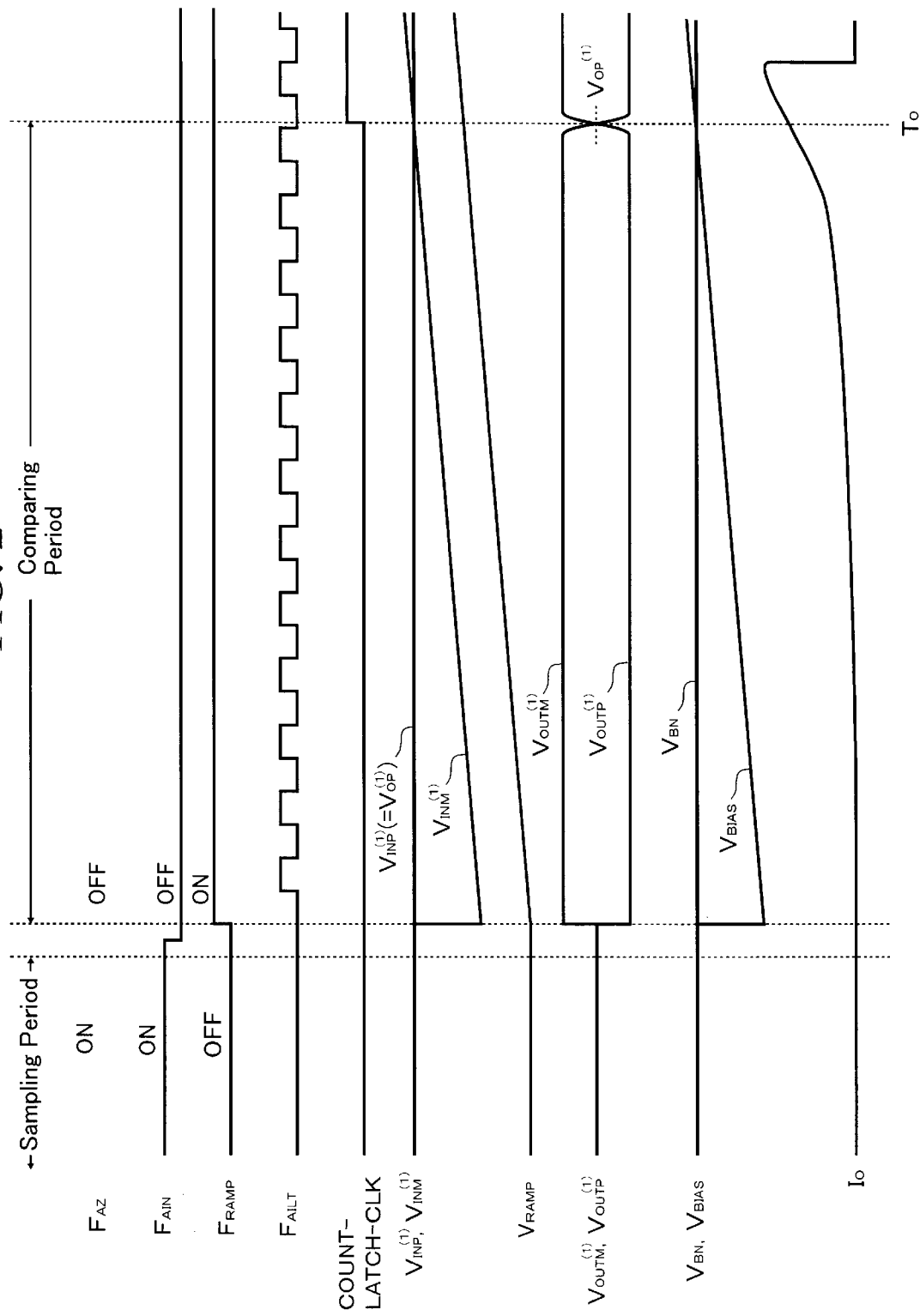
FIG. 2 is a timing chart of the analog/digital converter according to the embodiment of the present invention.

The operation of this analog/digital converter will be explained with reference to FIG. 1 and FIG. 2 hereunder. FIG. 2 is a timing chart of the analog/digital converter according to the present embodiment. As shown in FIG. 2, the timing is roughly divided into a sampling period and a comparing period.

① Sampling Period

In the sampling period, the switches S1, S3 to S7 are turned ON and only the switch S2 is turned OFF, so the entire configuration of the system become as follows:

(a) Since the positive input terminal INP and the negative output terminal OUTM of the first differential amplifier OP1 are short-circuited, a voltage of a node A becomes an operating-point voltage $V_{OP}^{(1)}$ of the first differential amplifier OP1. Similarly, since the negative input terminal INM and the positive output terminal OUTP are short-circuited, a voltage of a node B becomes the operating-point voltage $V_{OP}^{(1)}$. Here the operating-point voltage $V_{OP}^{(1)}$ means a self-bias point voltage of the first differential amplifier OP1. This voltage is equal to the voltage at which outputs $V_{OUTM}^{(1)}$ and $V_{OUTP}^{(1)}$ invert to cross when the first differential amplifier OP1 executes a comparing operation. This is also the case for the operating-point voltage $V_{OP}^{(2)}$ of the second differential amplifier OP2 described later.

(b) A voltage difference between both ends of the capacitor C1 becomes $V_{OP}^{(1)} - V_{REF}$.

(c) A voltage $V_{BIAS}$ of a node C becomes an output voltage $V_{BN}$ of a constant-voltage source 2. Here the voltage $V_{BN}$ is such a predetermined voltage that cause a desired bias current $I_o$ to flow through the first and second differential amplifiers OP1, OP2 respectively to bring them into their desired comparing operation states if such voltage $V_{BN}$ is directly applied to the bias terminal BIAS.

The desired bias current $I_o$ is decided as follows. That is, the bias current $I_o$ is related to the slew rate of the output signals of the first and second differential amplifiers OP1, OP2. When the operating frequency is increased, an output voltage difference between the positive and negative output terminals OUTP, OUTM is reduced unless the slew rate is increased by increasing the bias current $I_o$ and thus the compared result cannot stably be output. Therefore, the slew rate must be increased such that an output voltage amplitude difference between the output terminals exceeds the amplified voltage of unstable elements such as operating frequency and offset voltage arisen by the variation in precision of amplifiers OP1, OP2. The above desired bias current $I_o$ means the current that can give such slew rate.

(d) A voltage of a node D becomes the input voltage $V_{AIN}$.

(e) Since the voltage of the node C is $V_{BN}$ and the voltage of the node D is $V_{AIN}$, a voltage difference $V_{BN} - V_{AIN}$ is sample-held in the capacitor C3 (bias capacitor). On the other hand, since the voltage of the node B is $V_{OP}^{(1)}$, a voltage difference $V_{OP}^{(1)} - V_{AIN}$ is sample-held in the capacitor C2 (input capacitor).

(f) Meanwhile, both voltages of nodes E, F become the operating-point voltage $V_{OP}^{(2)}$ of the second differential amplifier OP2. This is because the positive input terminal INP and the negative output terminal OUTM of the amplifier OP2 are short-circuited via the switch S6, and because the negative input terminal INM and the positive output terminal OUTP of the amplifier OP2 are short-circuited via the switch S7.

(g) Since both voltages of the nodes A, B are $V_{OP}^{(1)}$, a voltage difference $V_{OP}^{(2)} - V_{OP}^{(1)}$ is stored in each offset canceling capacitors C4 and C5.

When this sampling period is ended, the switches S4 to S7 are turned OFF at a trailing edge of $F_{AZ}$ (see FIG. 2). Next, the switches S1 and S3 are turned OFF at a trailing edge of $F_{AIN}$. Even if these switches are turned OFF, the voltages of the nodes A to D and voltage differences between both ends of each capacitors C1 to C5 remain unchanged.

② Comparing Period

A comparing period is started at a rising edge of $F_{RAMP}$. When $F_{RAMP}$ is raised, though the switch S2 is turned ON, voltage differences between both ends of each capacitors C1 to C5 remain unchanged.

In particular, it should be noted that the voltage $V_{INP}^{(1)}$ of the node A is the same in both the sampling period and the comparing period and remains at $V_{OP}^{(1)}$.

Meanwhile, the ramp voltage $V_{RAMP}$ is supplied to the node D (i.e., other ends of the capacitors C3, C2) via the switch S2. Accordingly, the voltage $V_{INM}^{(1)}$ of the node B (i.e., one end of the input capacitor C2) becomes the sum $(V_{OP}^{(1)} - V_{AIN} + V_{RAMP})$ of the voltage $(V_{OP}^{(1)} - V_{AIN})$, which has already been sample-held in the input capacitor C2, and the ramp voltage ($V_{RAMP}$). Similarly, the voltage $V_{BIAS}$ of the node C (i.e., one end of the bias capacitor C3) becomes the sum $(V_{BN} - V_{AIN} + V_{RAMP})$ of the voltage $(V_{BN} - V_{AIN})$, which has already been sample-held in the bias capacitor C3, and the ramp voltage ($V_{RAMP}$).

In summary, the voltage values of each input terminals of the first differential amplifier OP1 in the comparing period are given as follows:

Positive input terminal voltage$(V_{INP}^{(1)}) = V_{OP}^{(1)}$

Negative input terminal voltage$(V_{INM}^{(1)}) = V_{OP}^{(1)} - V_{AIN} + V_{RAMP}$ Bias terminal voltage $(V_{BIAS}) = V_{BN} - V_{AIN} + V_{RAMP}$ In the first differential amplifier OP1, the voltages of the positive and negative input terminals, i.e., $V_{OP}^{(1)}$ and $V_{OP}^{(1)} - V_{AIN} + V_{RAMP}$ are compared, and its outputs are inverted when these voltages become equal to each other. The equality of both voltages means $V_{OP}^{(1)} = V_{OP}^{(1)} - V_{AIN} + V_{RAMP}$ and this means $V_{AIN} = V_{RAMP}$. Therefore, the input voltage ($V_{AIN}$) and the ramp voltage ($V_{RAMP}$) are compared in the amplifier OP1.

As shown in FIG. 2, the voltage $V_{BIAS}$ is smaller than the voltage $V_{BN}$ at the initial stage of the comparing period. This is because the initial value of the ramp voltage $V_{RAMP}$ is set smaller than the voltage at the node D (i.e., the input voltage $V_{AIN}$) in the sampling period and therefore, when the switch S2 is turned ON, the voltage at the node D is pulled down by the amount of difference between the initial value of the ramp voltage $V_{RAMP}$ and the input voltage $V_{AIN}$.

For the same reason, the voltage $V_{INM}$ at the node B is also pulled down by the amount of the difference between the initial value of the ramp voltage $V_{RAMP}$ and the input voltage $V_{AIN}$.

Being $V_{BIAS}<V_{BN}$ in the initial stage of the comparing period, the predetermined bias voltage $V_{BN}$ is not applied to the first and second differential amplifiers OP1, OP2. Accordingly, shoot through currents $I_o$ flowing both in inverter constructed by TR2, TR4 and in the inverter constructed by TR3, TR5 can be reduced in the first and second differential amplifiers OP1, OP2, which in turn suppresses the consumption power of the first and second differential amplifiers OP1, OP2. Specifically, according to the result of the simulation performed by the inventors of the present invention, the consumption current can be reduced to about ⅕ times of the prior art.

As shown in FIG. 2, $V_{INM}^{(1)}$ is increased at the same rate as the ramp voltage $V_{RAMP}$ and eventually becomes equal to $V_{INP}^{(1)}(=V_{OP}^{(1)}$: the operating-point voltage of the first differential amplifier OP1). Also, differential voltage outputs $V_{OUTM}^{(1)}$ and $V_{OUTP}^{(1)}$ become equal to $V_{OP}^{(1)}$.

Here, the voltages at the positive and negative input terminals INP, INM of the second differential amplifier OP2 will be discussed (see FIG. 1). Taking it into consideration that voltage on the input side of the offset canceling capacitor C4 is $V_{OUTM}^{(1)}$ and the voltage difference of the capacitor C4 is $V_{OP}^{(2)}-V_{OP}^{(1)}$, the voltage $V_{INP}^{(2)}$ at the positive input terminal INP is given as follows:

$$V_{INP}^{(2)}=V_{OUTM}^{(1)}+(V_{OP}^{(2)}-V_{OP}^{(1)}).$$

Considering in the same manner, the voltage $V_{INM}^{(2)}$ of the negative input terminal INP is given as follows:

$$V_{INM}^{(2)}=V_{OUTP}^{(1)}+(V_{OP}^{(2)}-V_{OP}^{(1)}).$$

It is understood from these equations that when both $V_{OUTM}^{(1)}$ and $V_{OUTP}^{(1)}$ become equal to $V_{OP}^{(1)}$, the voltage $V_{INP}^{(2)}$ becomes:

$$V_{INP}^{(2)}=V_{INM}^{(2)}=V_{OP}^{(2)}.$$

Therefore, it can be seen that the offset canceling capacitors C4, C5 allows the differential inputs of the second differential amplifier OP2 to invert at the same timing as the timing at which the differential outputs of the first differential amplifier OP1 inverts. This means also that the inversion of the differential inputs of the first differential amplifier OP1 and the inversion of the differential outputs of the second differential amplifier OP2 can be carried out at the same timing.

Meanwhile, it should be noted that $V_{BIAS}$ becomes equal to $V_{BN}$ at the time $T_o$ (see FIG. 2) at which $V_{INM}^{(1)}$ $(=V_{AIN}$: the input voltage) becomes equal to the ramp voltage $V_{RAMP}$. Therefore, at this time $T_o$ the predetermined bias voltage $V_{BN}$ is biased to the first and second differential amplifiers OP1, OP2 respectively, allowing each amplifiers OP1, OP2 to perform their desired comparing operation. However, this is not to be meant that $V_{BIAS}$ and $V_{BN}$ should be set equal at exactly the same time as $T_o$. Even if the timing at which $V_{BIAS}=V_{BN}$ is satisfied is slightly shifted forward or backward from $T_o$, the abovementioned advantage of reducing the bias current $I_o$ can be obtained. In other words, it suffices to become $V_{BIAS}=V_{BN}$ when $V_{INM}^{(1)}$ becomes substantially equal to the ramp voltage $V_{RAMP}$.

As shown in FIG. 1, since the second differential amplifier OP2 is provided at the later stage of the first differential amplifier OP1, its output gain is larger than that of the first differential amplifier OP1. This gain is large enough to make the comparator circuit 3 in the subsequent stage latch the data therein.

Based on the inversion of $V_{OUTM}^{(2)}$ and $V_{OUTP}^{(2)}$, the comparator circuit 3 sets the signal COUNT-LATCH-CLK to a high level.

At the same timing of the start of the comparing period, the counter 5 start to count the clock pulse and outputs the n-bit count value to the DAT latch circuit 4. When the signal COUNT-LATCH-CLK becomes the high level, the DAT latch circuit 4 latches the count value input thereto. This latched count value is just the analog/digital-converted value of the input voltage $V_{AIN}$.

As described above, the inversion of the differential inputs of the first differential amplifier OP1 and the inversion of the differential outputs of the second differential amplifier OP2 can be carried out at the same timing by providing the offset canceling capacitors C4, C5. Therefore, the analog/digital-converted value can be latched in the DAT latch circuit 4 without the deviation of the timing. As a result, the miss-count of the analog/digital-converted value due to the difference in the offset voltage between the first differential amplifier OP1 and the second differential amplifier OP2 can be prevented.

Up to this step, the analog/digital-converting operation is completed. After this, in order to suppress the wasteful power consumption in the circuit, all current paths are shut off at the rising edge of the signal COUNT-LATCH-CLK.

Though the present embodiment is explained in detail, the present invention is not limited to this embodiment. What is important is that the constant bias voltage is not applied to the comparator during the comparing operation, but the bias voltage is changed in accordance with the ramp voltage and then the predetermined voltage value that can bring the comparator into its comparing operation state is applied when the ramp voltage becomes substantially equal to the input voltage. If the circuit is able to perform such operation, the circuit configuration is not limited to the above configuration.

According to such circuit, only a small quantity of bias current flows in the period when the ramp voltage is small, and when the ramp voltage becomes substantially equal to the input voltage, the bias current increases to such a value that can perform the desired comparing operation. As a result, since total current flowing through the comparator can be reduced, the present invention brings about such an advantage that the consumption power in the comparator can be reduced.

As described above, according to the chopper type voltage comparator according to the present invention, the bias voltage is varied in accordance with the ramp voltage, and then the bias voltage comes up to the predetermined voltage value that can bring the chopper type voltage comparator into its comparing operation state when the ramp voltage becomes substantially equal to the input voltage.

Accordingly, since the amount of the total bias current can be reduced, the consumption power of the chopper type voltage comparator can be reduced.

This chopper type voltage comparator can be constructed by using the differential amplifier. In this case, the operating-point voltage is applied to the first input terminal of the differential amplifier (the first differential amplifier), while the voltage at one end of the input capacitor is applied to the second input terminal and the voltage at one end of the bias capacitor is applied to the bias terminal.

Then, in the sampling period, the difference between the operation-point voltage and the input voltage is sample-held in the input capacitor and also the difference between the predetermined voltage and the input voltage is sample-held in the bias capacitor.

After this, the voltages at the first input terminal and the second input terminal are compared mutually in the first differential amplifier by applying the ramp voltage to each other ends of the input capacitor and the bias capacitor.

According to this, the desired bias current flows through the first differential amplifier at the timing at which the ramp voltage becomes equal to the input voltage, whereas the bias current is suppressed before that timing. Therefore, the consumption power in the first differential amplifier can be suppressed.

Also, providing the second differential amplifier at the subsequent stage of the first differential amplifier allows the output gain to increase.

Furthermore, the offset canceling capacitor provided between the first and the second amplifier prevents the inverting timing of second amplifier outputs from sifting due to the difference between the operating-point voltages of two differential amplifiers.

Then, the consumption power of the analog/digital converter can be reduced by employing the above chopper type voltage comparator therein.

What is claimed is:

1. A chopper type voltage comparator for comparing a sampled input voltage with a ramp voltage that changes in accordance with a time, comprising
   a differential amplifier that compares the input voltage and the ramp voltage; and
   a bias voltage input terminal provided at an input portion of the differential amplifier for applying a bias voltage that varies in accordance with the input voltage and the ramp voltage,
   wherein the bias voltage brings the differential amplifier into a state in which a comparing operation cannot substantially be executed when the input voltage is smaller than the ramp voltage, and the bias voltage comes up to a predetermined voltage at which the differential amplifier is brought into the comaparing operation when the ramp voltage becomes substantially equal to the input voltage.

2. An analog/digital converter comprising:
   a chopper type voltage comparator set forth in claim 1;
   a counter; and
   a latch circuit for latching a count value of the counter based on an output of the chopper type voltage comparator, and then outputting the latched count value as an analog/digital-converted value of the input voltage.

3. A chopper type voltage comparator for comparing a sampled input voltage with a ramp voltage that changes in accordance with time, wherein a bias voltage is varied in accordance with the ramp voltage, and then the bias voltage comes up to a predetermined voltage value that is able to bring the chopper type voltage comparator into a comparing operation state when the ramp voltage becomes substantially equal to the input voltage, comprising:
   an input capacitor;
   a bias capacitor; and
   a first differential amplifier having a first input terminal to which an operating-point voltage is applied, a second input terminal to which a voltage at one end of the input capacitor is applied, and a bias terminal to which a voltage at one end of the bias capacitor is applied;
   wherein, in a sampling period, a difference between the input voltage and the operating-point voltage of the first differential amplifier is sample-held in the input capacitor, and a difference between the predetermined voltage and the input voltage is sample-held in the bias capacitor, and
   after the sampling period, voltages at the first input terminal and the second input terminal are compared mutually in the first differential amplifier by applying the ramp voltage to each other ends of the input capacitor and the bias capacitor.

4. A chopper type voltage comparator according to claim 3, wherein a second differential amplifier for amplifying an output of the first differential amplifier is provided at a subsequent stage of the first differential amplifier.

5. A chopper type voltage comparator according to claim 4, wherein an offset canceling capacitor for holding a voltage difference between operating-point voltages of the first differential amplifier and the second differential amplifier is provided between an output of the first differential amplifier and an input of the second differential amplifier.

6. An analog/digital converter comprising:
   a chopper type voltage comparator set forth in claim 3;
   a counter; and
   a latch circuit for latching a count value of the counter based on an output of the chopper type voltage comparator, and then outputting the latched count value as an analog/digital-converted value of the input voltage.

7. An analog/digital converter comprising:
   a chopper type voltage comparator set forth in claim 4;
   a counter; and
   a latch circuit for latching a count value of the counter based on an output of the chopper type voltage comparator, and then outputting the latched count value as an analog/digital-converted value of the input voltage.

8. An analog/digital converter comprising:
   a chopper type voltage comparator set forth in claim 5;
   a counter; and
   a latch circuit for latching a count value of the counter based on an output of the chopper type voltage comparator, and then outputting the latched count value as an analog/digital-converted value of the input voltage.

* * * * *

UNITED STATES PATENT AND TRADEMARK OFFICE
CERTIFICATE OF CORRECTION

PATENT NO. : 6,677,880 B2
DATED : January 13, 2004
INVENTOR(S) : Shyuki Yamamoto It is certified that error appears in the above-identified patent and that said Letters Patent is hereby corrected as shown below:

Column 1,
Lines 13 and 14, delete "the";
Line 22, "at to" should read -- to --;
Line 28, "pixels" should read -- pixel --;
Line 29, delete "above"

Signed and Sealed this

Fourth Day of January, 2005

JON W. DUDAS
*Director of the United States Patent and Trademark Office*